(12) United States Patent
Masuda et al.

(10) Patent No.: US 8,803,294 B2
(45) Date of Patent: Aug. 12, 2014

(54) SEMICONDUCTOR DEVICE AND METHOD FOR MANUFACTURING SAME

(75) Inventors: Takeyoshi Masuda, Osaka (JP); Shin Harada, Osaka (JP); Keiji Wada, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 22 days.

(21) Appl. No.: 13/529,602

(22) Filed: Jun. 21, 2012

(65) Prior Publication Data

US 2012/0326166 A1 Dec. 27, 2012

Related U.S. Application Data

(60) Provisional application No. 61/501,516, filed on Jun. 27, 2011.

(30) Foreign Application Priority Data

Jun. 27, 2011 (JP) .................................. 2011-141430

(51) Int. Cl.
*H01L 29/24* (2006.01)

(52) U.S. Cl.
USPC .......................................... 257/628; 257/627

(58) Field of Classification Search
USPC .............................. 257/77, 627, 628; 438/198
See application file for complete search history.

(56) References Cited

U.S. PATENT DOCUMENTS

| | | | |
|---|---|---|---|
| 5,882,786 A | 3/1999 | Nassau et al. | |
| 6,660,084 B1 * | 12/2003 | Shiomi et al. | 117/104 |
| 6,734,461 B1 * | 5/2004 | Shiomi et al. | 257/77 |
| 8,513,676 B2 * | 8/2013 | Harada et al. | 257/77 |
| 2012/0276715 A1 * | 11/2012 | Hori et al. | 438/455 |

FOREIGN PATENT DOCUMENTS

| | | |
|---|---|---|
| JP | 10-270689 | 10/1998 |
| JP | 2001-503726 | 3/2001 |
| JP | 2001-102576 | 4/2001 |
| JP | 2002-261275 A | 9/2002 |
| JP | 2004-071871 | 3/2004 |
| JP | 2007-165657 | 6/2007 |

\* cited by examiner

*Primary Examiner* — Eugene Lee
(74) *Attorney, Agent, or Firm* — Venable LLP; Michael A. Sartori; Tamatane J. Aga

(57) ABSTRACT

A substrate has a surface made of a semiconductor having a hexagonal single-crystal structure of polytype 4H. The surface of the substrate is constructed by alternately providing a first plane having a plane orientation of (0-33-8), and a second plane connected to the first plane and having a plane orientation different from the plane orientation of the first plane. A gate insulating film is provided on the surface of the substrate. A gate electrode is provided on the gate insulating film.

17 Claims, 12 Drawing Sheets

SEMICONDUCTOR DEVICE AND METHOD FOR MANUFACTURING SAME

BACKGROUND OF THE INVENTION

1. Field of the Invention

The present invention relates to a semiconductor device and a method for manufacturing the semiconductor device, more particularly, a semiconductor device having a gate electrode and a method for manufacturing such a semiconductor device.

2. Description of the Background Art

A MOSFET (Metal Oxide Semiconductor Field Effect Transistor) is an exemplary semiconductor device having a gate electrode. Japanese Patent Laying-Open No. 2002-261275 discloses a MOS device having a metal electrode provided on an upper surface of an oxide film provided on an upper surface of 4H type SiC.

A channel mobility is one of performance indexes of a MOSFET. The channel mobility indicates mobility of carriers in a channel. Increase of the channel mobility can lead to reduced on-resistance or increased operation speed. It is known that the channel mobility depends on a plane orientation of the channel surface. Accordingly, a specific plane orientation is employed in a semiconductor substrate used for manufacturing of semiconductor devices. For example, according to the technique described in the above-described patent publication, the plane of the 4H type SiC having the oxide film provided thereon corresponds to the {03-38} plane, or corresponds to a plane having an off angle of 10° or smaller relative to the {03-38} plane.

The patent publication describes a reason why the {03-38} plane allows for a high channel mobility as follows: "Thus, the channel mobility of the MOS device can be increased by providing the oxide film on the surface of SiC having a plane corresponding to the {03-38} plane or a plane having an off angle of 10° or smaller relative to the {03-38} plane. This is presumably due to the following reason. That is, the {0001} plane of SiC is a hexagonal close-packed plane, and therefore has a high density of unbounded chemical bonds per unit area for constituent atoms. Accordingly, interface states are increased to prevent traveling of electrons. In contrast, the {03-38} plane is deviated from the hexagonal close-packed plane, and thus facilitates traveling of electrons. Further, particularly high channel mobility is obtained in the {03-38} plane because even though the {03-38} plane is away from the close-packed plane, bounded chemical bonds of atoms appear relatively cyclically in the surface."

For example, in the case of using silicon carbide of polytype 4H, it is desirable to employ the {03-38} plane for the channel as described above in order to improve performance of the semiconductor device. Further, according to inspection by the present inventors, it is particularly preferable to employ the (0-33-8) plane of the {03-38} plane. However, the present inventors have found that a normal silicon carbide substrate obtained by cutting an ingot along a plane orientation of (0-33-8) has a surface corresponding to the (0-33-8) plane macroscopically, but has the plane orientation of (0-33-8) at an unexpectedly low ratio microscopically. In other words, it has been found that with the conventional method, the (0-33-8) plane allowing for high channel mobility is not sufficiently effectively employed.

More generally, the present inventors have found that microscopic control for the plane orientation of the channel surface to increase channel mobility has not been examined sufficiently. By increasing the channel mobility, performance of the semiconductor device can be improved. Hence, by microscopically controlling the channel surface, it is expected to obtain a larger channel mobility.

SUMMARY OF THE INVENTION

The present invention has been made to solve the foregoing problem, and has its object to provide a semiconductor device having a large channel mobility as well as a method for manufacturing such a semiconductor device.

A semiconductor device according to one aspect of the present invention includes a substrate, a gate insulating film, and a gate electrode. The substrate has a surface made of a semiconductor having a hexagonal single-crystal structure of polytype 4H. The surface of the substrate is constructed by alternately providing a first plane having a plane orientation of (0-33-8) and a second plane connected to the first plane and having a plane orientation different from the plane orientation of the first plane. The gate insulating film is provided on the surface of the substrate. The gate electrode is provided on the gate insulating film.

In the semiconductor device according to the above-described one aspect, the second plane preferably has a plane orientation of (0-11-1).

In the semiconductor device according to the above-described one aspect, the semiconductor is preferably silicon carbide.

A semiconductor device according to another aspect of the present invention includes a substrate, a gate insulating film, and a gate electrode. The substrate has a surface made of a semiconductor having a single-crystal structure other than a cubic structure. The single-crystal structure cyclically includes an equivalent structure to the cubic structure. The surface of the substrate is constructed by alternately providing a first plane having a plane orientation of (001) in the equivalent structure, and a second plane connected to the first plane and having a plane orientation different from the plane orientation of the first plane. The gate insulating film is provided on the surface of the substrate. The gate electrode is provided on the gate insulating film.

In the semiconductor device according to the another aspect, the single-crystal structure is preferably one of a hexagonal structure and a rhombohedral structure.

A method for manufacturing a semiconductor device in the present invention includes the following steps. A substrate is prepared which has a surface made of silicon carbide having a hexagonal single-crystal structure of polytype 4H. The surface of the substrate is chemically treated so as to alternately form, in the surface of the substrate, a first plane having a plane orientation of (0-33-8) and a second plane connected to the first plane and having a plane orientation different from the plane orientation of the first plane. A gate insulating film is formed on the surface of the substrate. A gate electrode is formed on the gate insulating film.

In the method for manufacturing the semiconductor device, the second plane preferably has a plane orientation of (0-11-1).

In the method for manufacturing the semiconductor device, the step of chemically treating the surface preferably includes the step of chemically etching the surface. More preferably, the step of chemically etching the surface includes the step of thermally etching the surface. Further preferably, the step of thermally etching the surface includes the step of heating the substrate in an atmosphere including at least one or more types of halogen atom. The at least one or more types of halogen atom preferably includes at least one of chlorine atom and fluorine atom.

According to the present invention, the channel mobility can be made large.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
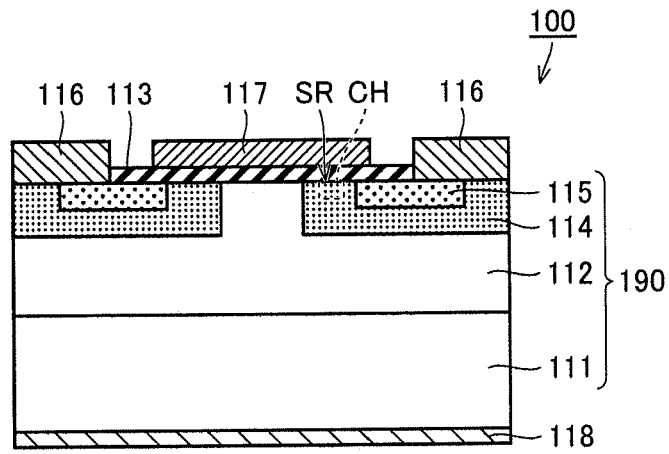
FIG. 1 is a cross sectional view schematically showing a configuration of a semiconductor device in a first embodiment of the present invention.

The following describes an embodiment of the present invention based on drawings. It should be noted that in the below-mentioned figures, the same or corresponding portions are given the same reference characters and are not described repeatedly. Further, in the present specification, an individual orientation is represented by [ ], a group orientation is represented by < >, and an individual plane is represented by ( ) and a group plane is represented by { }. In addition, a negative index is supposed to be crystallographically indicated by putting "-" (bar) above a numeral, but is indicated by putting the negative sign before the numeral in the present specification.

First Embodiment

Figure 2:
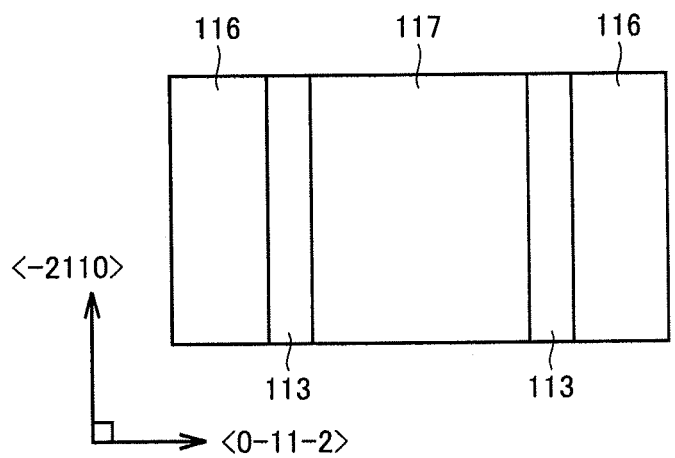
FIG. 2 is a schematic plan view of the semiconductor device of FIG. 1.

As shown in FIG. 1 and FIG. 2, a semiconductor device of the present embodiment is a silicon carbide semiconductor device, specifically, is a MOSFET 100, more specifically, is a vertical type DiMOSFET (Double implanted MOSFET). MOSFET 100 includes an epitaxial substrate 190, a gate insulating film 113, a gate electrode 117, source electrodes 116, and a drain electrode 118.

Epitaxial substrate 190 has a single-crystal substrate 111, an epitaxial layer 112 formed on single-crystal substrate 111, and impurity regions 114 and 115. Each of single-crystal substrate 111, epitaxial layer 112, and impurity regions 115 has a first conductivity type (n type in the present embodiment), and impurity regions 114 have a second conductivity type (p type in the present embodiment) different from the first conductivity type. As an impurity (n type impurity) for providing the n type conductivity to silicon carbide, nitrogen (N) or phosphorus (P) can be used, for example. As an impurity (p type impurity) for providing the p type conductivity to silicon carbide, aluminum (Al) or boron (B) can be used, for example.

Single-crystal substrate 111 is made of silicon carbide having a hexagonal single-crystal structure of polytype 4H. Single-crystal substrate 111 has one main surface (upper surface in FIG. 1) having a plane orientation substantially corresponding to the (0-11-2) plane. On the one main surface of single-crystal substrate 111, epitaxial layer 112 made of silicon carbide is formed. Preferably, epitaxial layer 112 has an impurity concentration lower than that of single-crystal substrate 111. Each of impurity regions 114 is formed on a portion of epitaxial layer 112. Each of impurity regions 115 is formed in a portion of impurity region 114 so as to be separated from epitaxial layer 112 by impurity region 114. With this configuration, impurity region 114 has a channel CH located at its front-side surface side and sandwiched between epitaxial layer 112 and impurity region 115. Preferably, in channel CH, carriers flow in a channel direction, which is a direction in parallel with <0-11-2> and orthogonal to <-2110>.

On the other main surface (the lower surface in FIG. 1) of single-crystal substrate 111, drain electrode 118 is formed. Preferably, drain electrode 118 is an ohmic electrode.

Gate insulating film 113 is formed on a portion of a surface SR of epitaxial substrate 190, in particular, on surface SR of channel CH. Gate insulating film 113 is, for example, an oxide film. It should be noted that gate insulating film 113 may have a multilayer structure.

Gate electrode 117 is formed on gate insulating film 113. Source electrodes 116 are formed on impurity regions 114 and 115.

Surface SR is formed of a semiconductor (silicon carbide in the present embodiment) having a hexagonal single-crystal structure of polytype 4H. In the present embodiment, epitaxial substrate 190 entirely has a hexagonal single-crystal structure of polytype 4H. The following describes details of surface SR.

Figure 3:
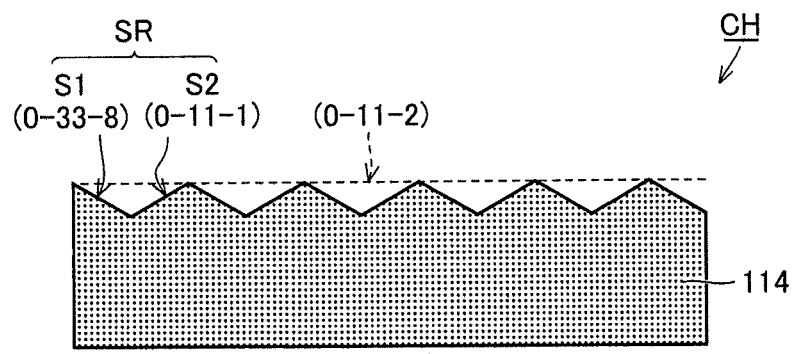
FIG. 3 is a partial enlarged view of FIG. 1.

As shown in FIG. 3, microscopically, surface SR is a chemically stable surface constructed by alternately providing planes S1 (first planes) and planes S2 (second planes). Each of planes S1 has a plane orientation of (0-33-8) whereas each of planes S2 is connected to plane S1 and has a plane orientation different from that of plane S1. Here, the term "microscopically" refers to "minutely to such an extent that at least the size about twice as large as a below-described interatomic spacing is considered". Preferably, plane S2 has a plane orientation of (0-11-1). Surface SR thus constituted of plane S1 and plane S2 preferably has a plane inclined relative to a plane orientation of (0-11-2) by 5° or smaller on average, more preferably, has a plane substantially having a plane orientation of (0-11-2).

Figure 4:
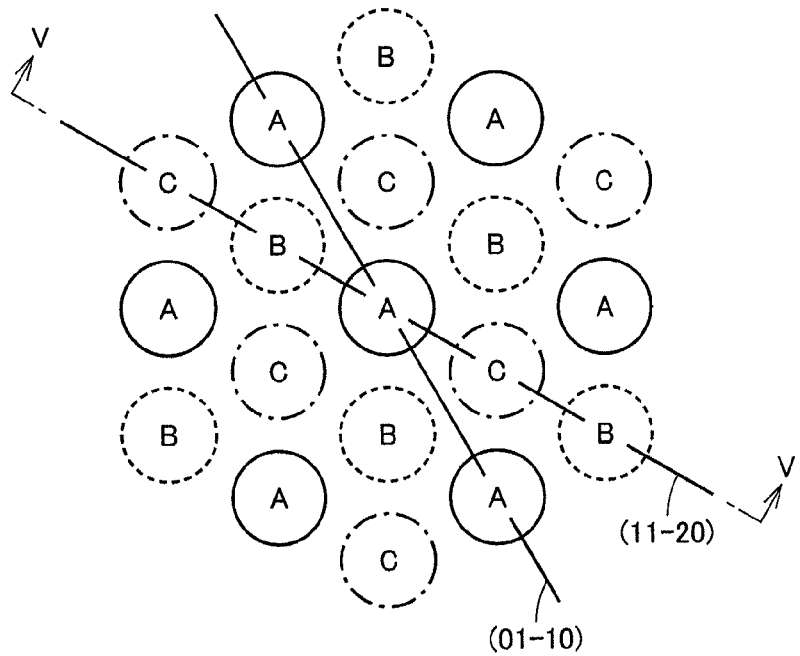
FIG. 4 shows a crystal structure of the (000-1) plane in a polytype 4H hexagonal structure.

Generally, regarding Si atoms (or C atoms), when viewing a silicon carbide single-crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 4. In other words, with four layers ABCB being regarded as one cycle, a cyclic stacking structure such as ABCBABCBAB-CB . . . is provided.

Figure 5:
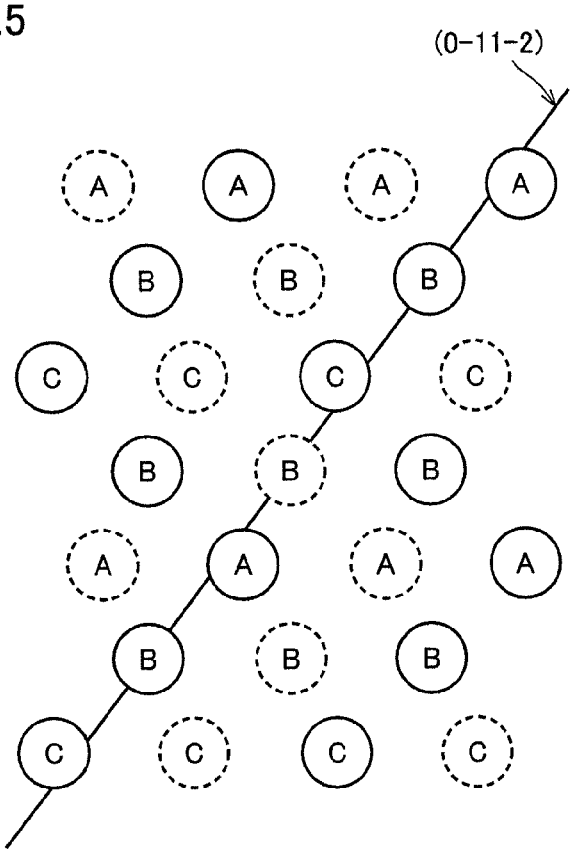
FIG. 5 shows a crystal structure of the (11-20) plane when taken along a line V-V of FIG. 4.

As shown in FIG. 5, in the (11-20) plane (cross section taken along a line V-V of FIG. 4), atoms in each of four layers ABCB constituting the above-described one cycle are not aligned completely along the (0-11-2) plane. In FIG. 5, the (0-11-2) plane is illustrated to pass through the locations of the atoms in layers B. In this case, each of atoms in layers A and B is deviated from the (0-11-2) plane. Hence, even when the macroscopic plane orientation of the surface of the silicon carbide single-crystal, i.e., the plane orientation thereof with its atomic level structure being ignored is limited to (0-11-2), this surface can have various structures microscopically.

Figure 6:
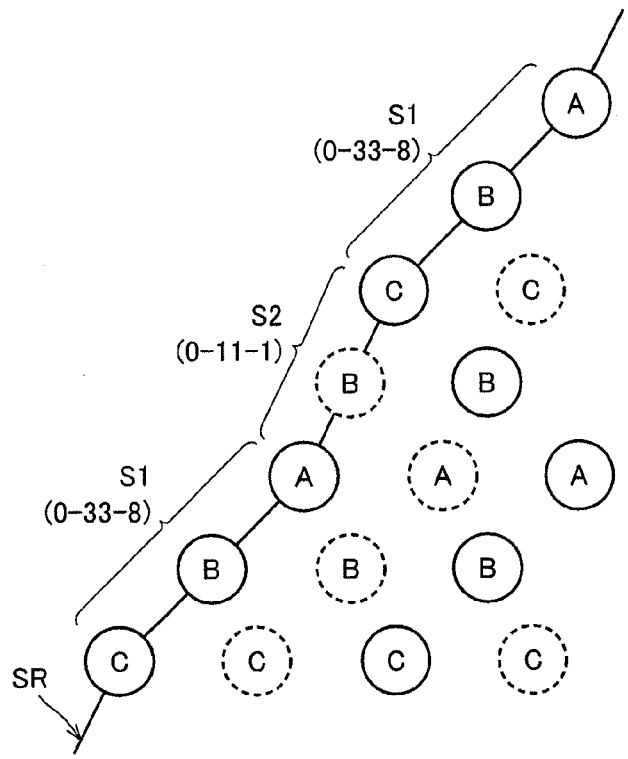
FIG. 6 shows, in the (11-20) plane, a crystal structure in the vicinity of a surface of a channel in the semiconductor device of FIG. 1.

As shown in FIG. 6, in the present embodiment, surface SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 5).

Figure 7:
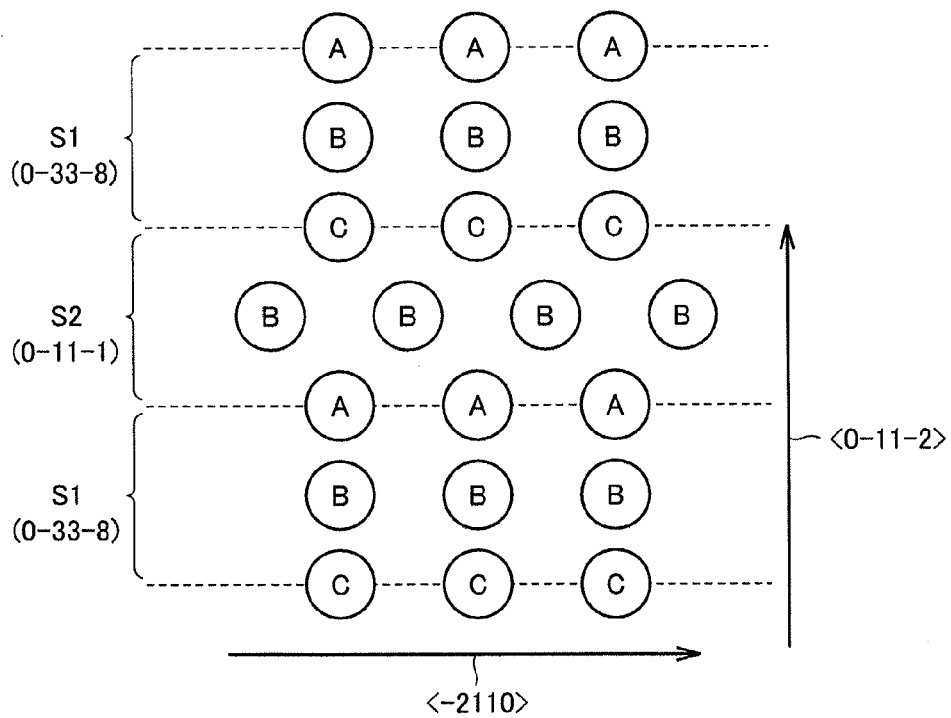
FIG. 7 shows the surface of the channel in the semiconductor device of FIG. 1 when viewed from the (01-10) plane.

As shown in FIG. 7, when viewing surface SR from the (01-10) plane, the single-crystal structure has a portion cyclically including a structure (plane S1 portion) equivalent to a cubic structure. Specifically, surface SR is constructed by alternately providing planes S1 having a plane orientation of (001) in the above-described structure equivalent to the cubic structure and planes S2 connected to planes S1 and having a plane orientation different from that of each of planes S1. Also in a single-crystal structure other than polytype 4H, the surface can be thus constituted of the planes (planes S1 in FIG. 7) having a plane orientation of (001) in the structure equivalent to the cubic structure and the planes (planes S2 in FIG. 7) connected to the foregoing planes and having a plane orientation different from that of each of the foregoing planes. This single-crystal structure is not limited to the hexagonal structure, may be a single-crystal structure other than the cubic structure, and may be a rhombohedral structure, for example. Further, the polytype is not limited to 4H, and may be 6H or 15R, for example. Further, the semiconductor is not limited to silicon carbide (SiC), and may be gallium nitride (GaN), for example.

The following describes a method for manufacturing MOSFET 100.

Figure 8:
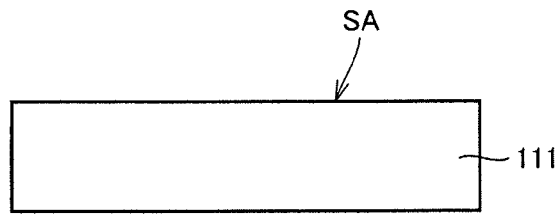
FIG. 8 is a cross sectional view schematically showing a first step of a method for manufacturing the semiconductor device in the first embodiment of the present invention.

As shown in FIG. 8, single-crystal substrate 111 is prepared which is made of silicon carbide having a hexagonal single-crystal structure of polytype 4H. Single-crystal substrate 111 has a surface SA. Surface SA preferably has a plane orientation corresponding to the (0-11-2) plane or a plane inclined by 5° or smaller relative to the (0-11-2) plane. Surface SA can be formed by means of mechanical polishing or slicing.

Figure 9:
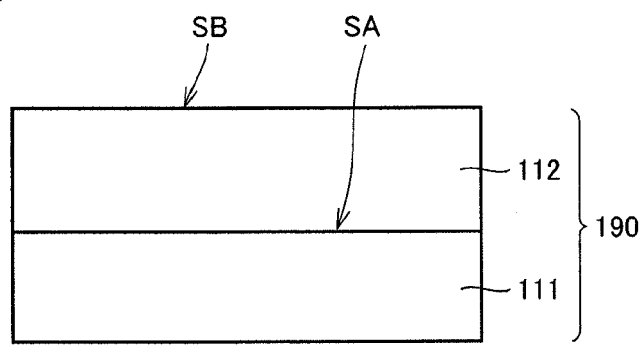
FIG. 9 is a cross sectional view schematically showing a second step of the method for manufacturing the semiconductor device in the first embodiment of the present invention.

As shown in FIG. 9, on surface SA of single-crystal substrate 111, epitaxial layer 112 made of silicon carbide are formed. Epitaxial layer 112 has a surface SB, which is a growth surface. Surface SB has a hexagonal single-crystal structure of polytype 4H in conformity with the crystal structure of surface SA. Surface SB preferably has a plane orientation corresponding to the (0-11-2) plane or a plane inclined by 5° or smaller relative to the (0-11-2) plane. It should be noted that surface SB of epitaxial layer 112 may be mechanically polished to be planarized.

Next, surface SB is chemically treated. Specifically, surface SB is chemically etched. This etching can be performed by, for example, heating epitaxial substrate 190 in an atmosphere containing at least one or more types of halogen atom. The at least one or more types of halogen atom include at least one of chlorine (Cl) atom and fluorine (F) atom. This atmosphere is, for example, $Cl_2$, $BCL_3$, $SF_6$, or $CF_4$.

Figure 10:
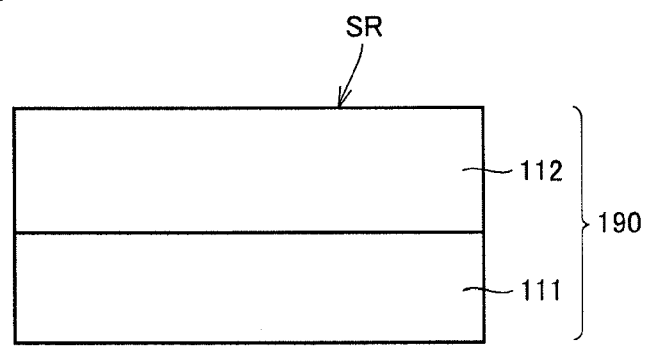
FIG. 10 is a cross sectional view schematically showing a third step of the method for manufacturing the semiconductor device in the first embodiment of the present invention.

As shown in FIG. 10, as a result of the above-described chemical treatment, surface SR is spontaneously formed. In other words, as shown in FIG. 6 and FIG. 7, planes S1 having a plane orientation of (0-33-8) and planes S2 connected to planes S1 and having a plane orientation different from that of each of planes S1 are alternately formed spontaneously. Each of planes S2 has a plane orientation of, specifically, (0-11-1).

Figure 11:
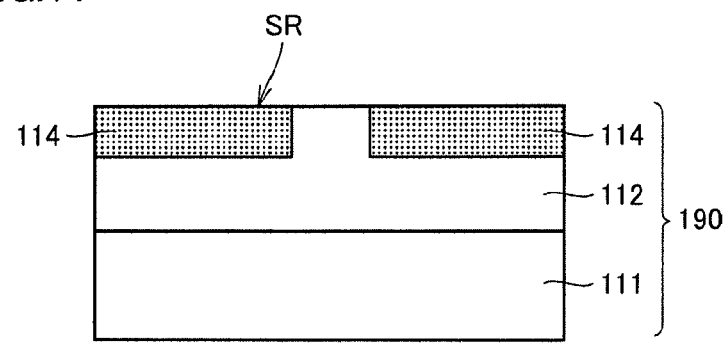
FIG. 11 is a cross sectional view schematically showing a fourth step of the method for manufacturing the semiconductor device in the first embodiment of the present invention.

As shown in FIG. 11, impurity regions 114 are formed. Specifically, ions of a p type impurity are selectively implanted into regions to be formed into impurity regions 114. Such selective implantation can be performed by use of a mask for ion implantation and selection of energy for ion implantation.

It should be noted that the above-described chemical treatment (specifically, chemical etching) may be performed after the ion implantation for forming impurity regions 114. In this case, atomic arrangement in surface SR can be prevented from being disarranged by the ion implantation.

Figure 12:
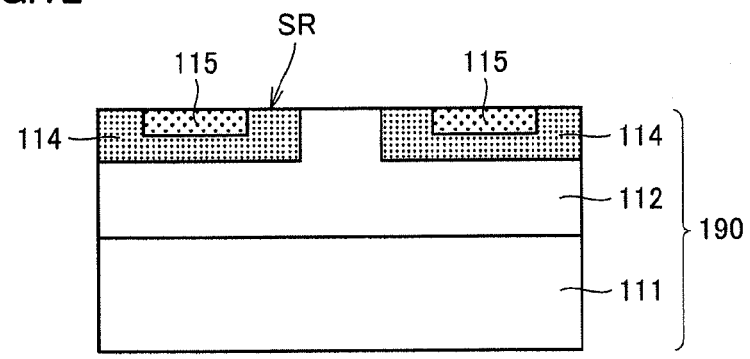
FIG. 12 is a cross sectional view schematically showing a fifth step of the method for manufacturing the semiconductor device in the first embodiment of the present invention.

As shown in FIG. 12, impurity regions 115 are formed. Specifically, ion implantation of an n type impurity is performed to form impurity regions 115. It should be noted that this ion implantation may be performed before the above-described ion implantation for forming impurity region 114.

Next, activation annealing treatment is performed to activate the implanted impurities. For example, heating is performed for 30 minutes at a temperature of approximately 1700° C. in an atmosphere of argon (Ar) gas.

It should be noted that the above-described chemical treatment (specifically, chemical etching) may be performed after the activation annealing. In this case, atomic arrangement in surface SR can be prevented from being disarranged by the activation annealing.

Figure 13:
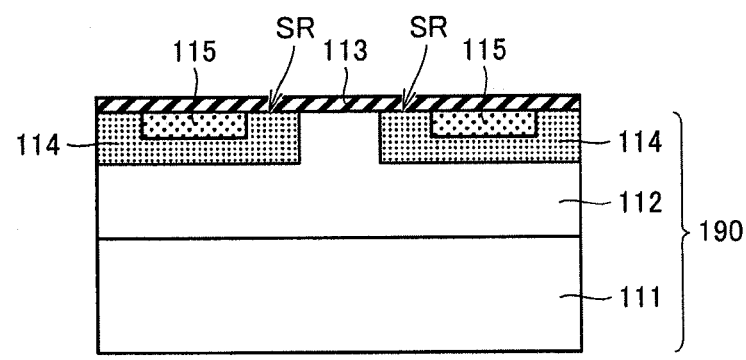
FIG. 13 is a cross sectional view schematically showing a sixth step of the method for manufacturing the semiconductor device in the first embodiment of the present invention.

As shown in FIG. 13, gate insulating film 113 is formed on surface SR. Gate insulating film 113 is formed by means of, for example, dry oxidation (thermal oxidation). The dry oxidation is performed by performing heating for approximately 30 minutes at a temperature of approximately 1200° C. in air or oxygen, for example.

Next, nitrogen annealing is performed. Accordingly, the nitrogen concentration is adjusted to have a maximum value of $1 \times 10^{21}/cm^3$ or greater in a region within 10 nm from an interface between epitaxial substrate 190 and gate insulating film 113. For example, in an atmosphere of gas containing nitrogen, such as nitrogen monoxide (NO) gas, heating is performed at a temperature of approximately 1100° C. for approximately 120 minutes.

After this nitrogen annealing treatment, inert gas annealing treatment may be performed additionally. For example, in argon gas atmosphere, heating is performed at a temperature of approximately 1100° C. for approximately 60 minutes. Accordingly, high channel mobility can be attained with good reproducibility.

Figure 14:
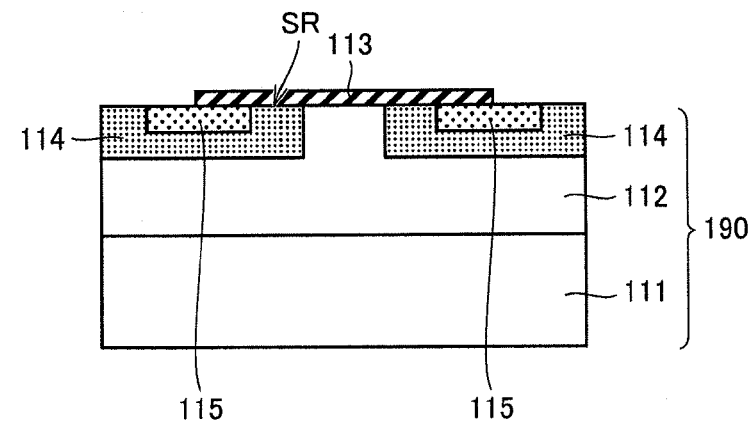
FIG. 14 is a cross sectional view schematically showing a seventh step of the method for manufacturing the semiconductor device in the first embodiment of the present invention.

As shown in FIG. 14, gate insulating film 113 is patterned. This patterning can be performed by means of, for example, photolithography and etching.

As shown in FIG. 1, source electrodes 116 are formed in contact with surfaces of impurity regions 115 of epitaxial substrate 190. Each of source electrodes 116 is made of, for example, nickel (Ni). Preferably, annealing for alloying is performed to attain more ohmic electrical connection between source electrode 116 and epitaxial substrate 190. For example, in an atmosphere of an inert gas such as argon gas, heating is performed for approximately 2 minutes at a temperature of approximately 950° C.

Further, gate electrode 117 is formed on the surface of gate insulating film 113. Gate electrode 117 is made of, for example, aluminum.

Further, drain electrode 118 is formed on single-crystal substrate 111. Drain electrode 118 is made of, for example, nickel.

In this way, MOSFET 100 is obtained.

According to MOSFET 100 in the present embodiment, surface SR (FIG. 1) of channel CH is constructed by alternately providing planes S1 having a plane orientation of (0-33-8) and planes S2 connected to planes S1 and having a plane orientation different from that of each of planes S1, as shown in FIG. 6 and FIG. 7. According to this configuration, in the surface of channel CH, a ratio of the plane orientation of (0-33-8) can be made large. This leads to increased channel mobility. Preferably, each of planes S2 has a plane orientation of (0-11-1). In this way, in the surface of channel CH, a ratio of the plane orientation of (0-33-8) can be further increased.

This will be discussed in a more general manner as follows. That is, the single-crystal structure of epitaxial substrate 190 has a portion cyclically including a structure (plane S1 portion) equivalent to the cubic structure as shown in FIG. 7. Specifically, surface SR is constructed by alternately providing planes S1 having a plane orientation of (001) in the structure equivalent to the cubic structure and planes S2 connected to planes S1 and having a plane orientation different from that of each of planes S1. With this configuration, a ratio of portion corresponding to the plane orientation of (001) of the cubic structure can be increased in surface SR. Accordingly, the channel mobility can be increased. As described above, the single-crystal structure having a portion with a structure equivalent to the cubic structure is not limited to the hexagonal structure, may be a single-crystal structure other than the cubic structure, and may be a rhombohedral structure, for example. Further, the polytype is not limited to 4H and may be 6H or 15R, for example. Further, the semiconductor is not limited to silicon carbide (SiC) and may be gallium nitride (GaN), for example.

Further, according to the method for manufacturing MOSFET 100 in the present embodiment, surface SB (FIG. 9) is chemically treated to spontaneously form surface SR (FIG. 6), which is controlled in atomic level as shown in FIG. 6. More specifically, surface SB is chemically etched to spontaneously form surface SR (FIG. 6). The chemical etching is thermal etching, specifically. For example, heating is performed in an atmosphere including at least one or more types of halogen atom. The at least one or more types of halogen atom may include at least one of chlorine atom and fluorine atom.

Figure 15:
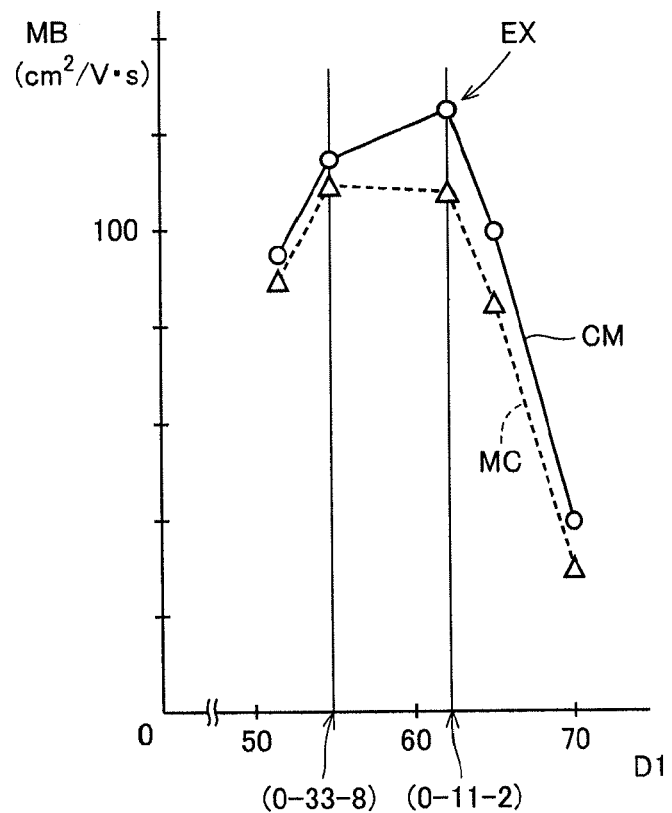
FIG. 15 is a graphical representation showing an exemplary relation between a channel mobility MB and an angle between a macroscopically viewed channel surface and the (000-1) plane when thermal etching is performed and showing the relation therebetween when no thermal etching is performed.

The following describes function and effect provided by the present embodiment with reference to a result of experiment in a graph of FIG. 15. In the graph of FIG. 15, the horizontal axis represents an angle D1 formed by the (000-1) plane and the macroscopic plane orientation of surface SR of channel CH, whereas the vertical axis represents channel mobility MB. A group of plots CM correspond to a case where surface SB is thermally etched, whereas a group of plots MC correspond to a case where surface SB is not thermally etched.

In group of plots MC, channel mobility MB is at maximum when the surface of channel CH has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, channel mobility MB in group of plots CM is at maximum when the macroscopic plane orientation of the surface of channel CH is (0-11-2) (in the case of an example indicated by an arrow EX). This is presumably due to the following reason. That is, as shown in FIG. 6 and FIG. 7, the multiplicity of planes S1 each having a plane orientation of (0-33-8) are densely and regularly arranged with planes S2 interposed therebetween, whereby a ratio of the microscopic plane orientation of (0-33-8) becomes high in the surface of channel CH.

Referring to FIG. 16 to FIG. 19, the following describes factors that can influence the channel mobility, apart from the plane orientation.

Figure 16:
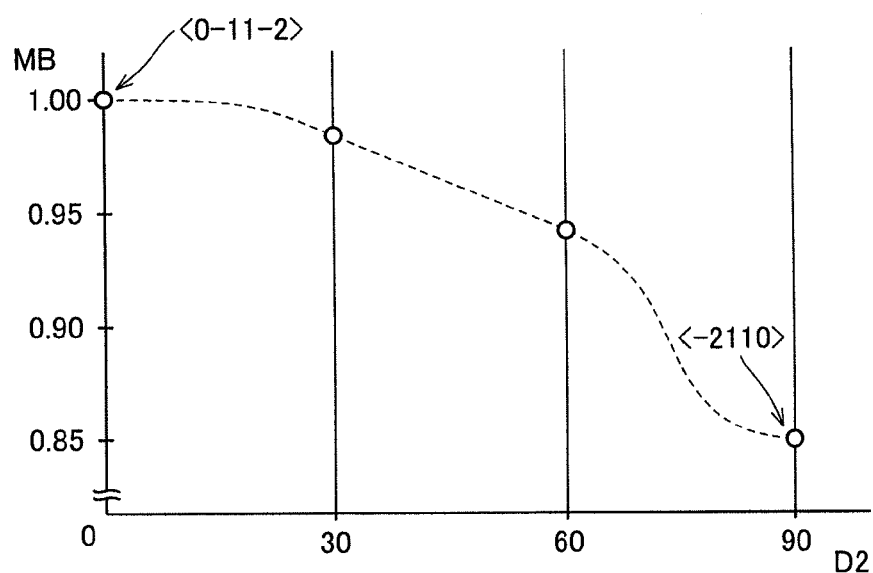
FIG. 16 is a graphical representation showing an exemplary relation between channel mobility MB and an angle between the channel direction and the <0-11-2> direction.

In a graph shown in FIG. 16, the horizontal axis represents an angle D2 between the channel direction and the <0-11-2> direction, whereas the vertical axis represents channel mobility MB (in an arbitrary unit). A broken line is provided therein for viewability of the graph. From this graph, it has been found that in order to increase channel mobility MB, angle D2 is preferably not less than 0° and not more than 60°, more preferably, angle D2 is substantially 0°. It should be noted that FIG. 2 shows MOSFET 100 having a channel direction of <0-11-2>.

Figure 17:
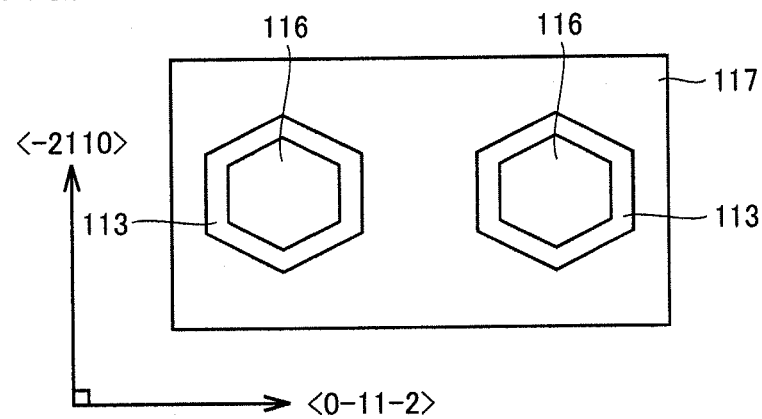
FIG. 17 is a plan view schematically showing a configuration of a semiconductor device of a variation of the first embodiment of the present invention.

It should be noted that MOSFET 100 (FIG. 2) can be formed such that as shown in a schematic plan view of FIG. 17, each of source electrodes 116 is formed to have a hexagon surface and the region is formed as gate electrode 117 except the partial region surrounding the periphery of source electrodes 116, for example. In this case, a degree of integration of MOSFETs 100 can be large while facilitating formation of the channel in a direction falling within a range of ±60° relative to the <0-11-2> direction.

Figure 18:
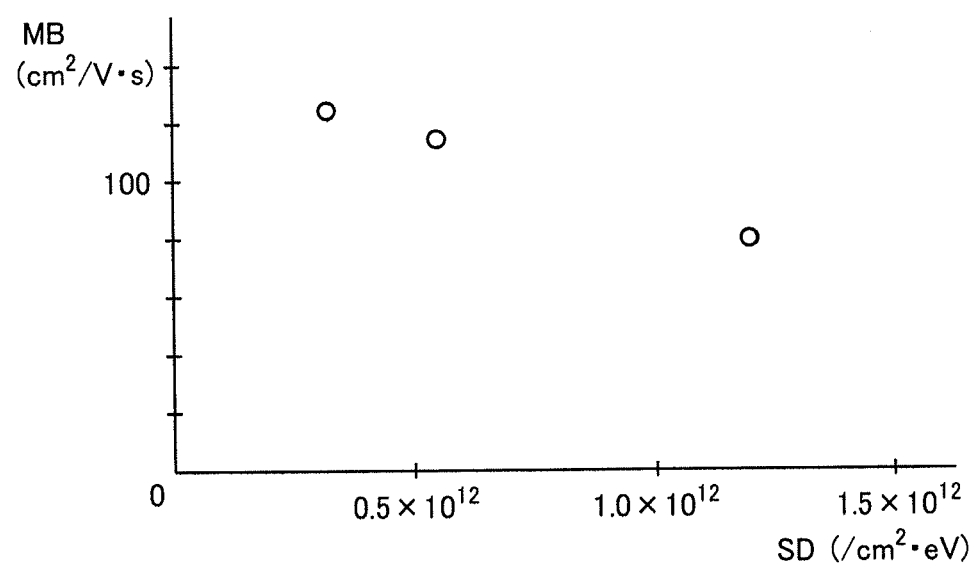
FIG. 18 is a graphical representation showing an exemplary relation between interface state density and channel mobility.

In a graph shown in FIG. 18, the horizontal axis represents an interface state density SD with interface states of 0.2 eV to 0.3 eV between gate insulating film 113 and impurity region 114 (FIG. 1), whereas the vertical axis represents channel mobility MB. From this graph, it has been found that in order to increase channel mobility MB, interface state density SD is preferably $1 \times 10^{12}$ cm$^2$/(V·s) or smaller.

Figure 19:
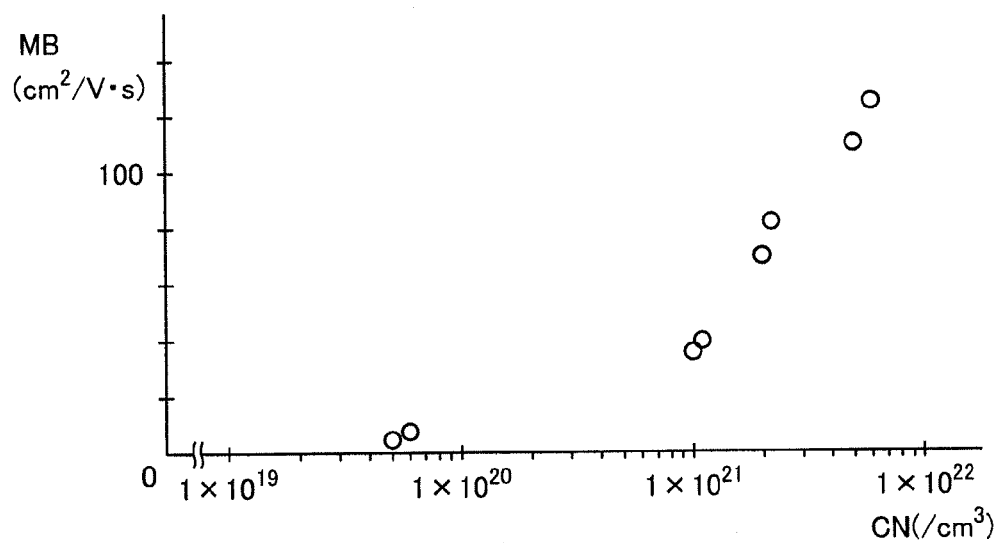
FIG. 19 is a graphical representation showing an exemplary relation between nitrogen concentration and channel mobility, at an interface between the gate insulating film and the channel in the case where nitrogen annealing has been performed.
Figure 20:
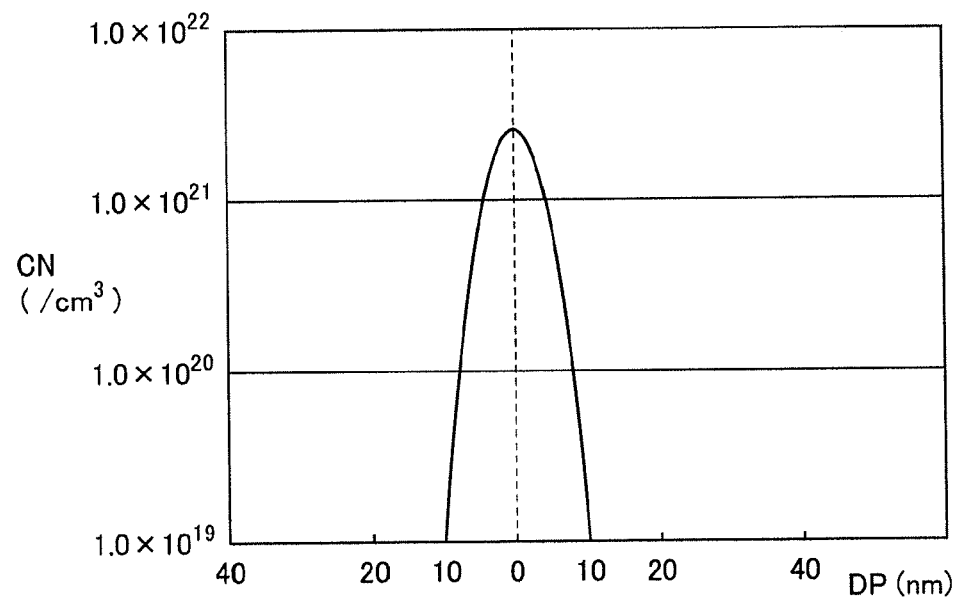
FIG. 20 is a graphical representation showing an exemplary profile of a nitrogen concentration in the vicinity of the interface between the gate insulating film and the channel in the case where nitrogen annealing has been performed.

It should be noted that this interface state density SD can be reduced by annealing. This annealing desirably includes nitrogen annealing. A graph of FIG. 19 shows results of measurement of channel mobility in the case of performing the nitrogen annealing. In FIG. 19, the horizontal axis represents a nitrogen concentration CN at an interface between gate insulating film 113 and impurity region 114 (FIG. 1), whereas the vertical axis represents channel mobility MB. From this graph, it has been found that in order to increase channel mobility MB, nitrogen concentration CN is preferably $1 \times 10^{21}$/cm$^3$ or greater. FIG. 20 shows one exemplary profile of a nitrogen concentration in the case where such a condition is satisfied. It should be noted that instead of the nitrogen annealing, hydrogen annealing can be employed.

It should be noted that surface SR of channel CH of MOSFET 100 may include a portion constituted of planes S1 and S2 (FIG. 6 and FIG. 7) provided alternately, and the entire portion of surface SR does not need to be thus constituted. In order to increase a ratio of the portion thus constituted, it is preferable that the macroscopic plane orientation of surface SR is close to the (0-11-2) plane. Specifically, it is preferable that the macroscopic plane orientation of surface SR is inclined relative to the (0-11-2) plane within a range of ±5° in the <0-110> direction. Further, this inclination preferably falls within a range of ±10° or smaller in the <12110> direction. This leads to reduction of steps on surface SR, which have influence over carriers flowing in the channel.

Second Embodiment

Figure 21:
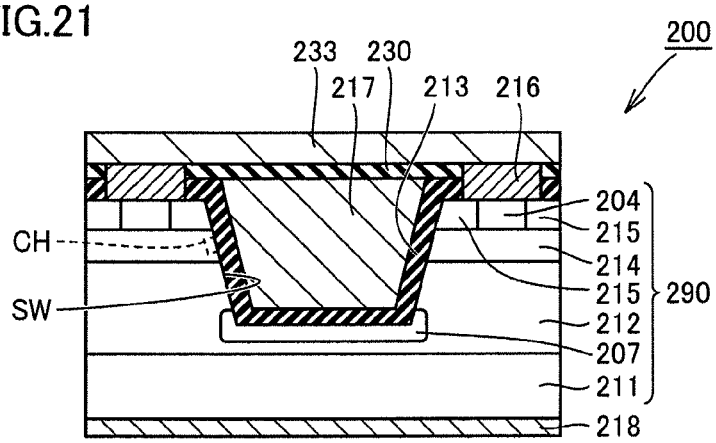
FIG. 21 is a cross sectional view taken along a line XXI-XXI of FIG. 22 to schematically show a configuration of a semiconductor device in a second embodiment of the present invention.
Figure 22:
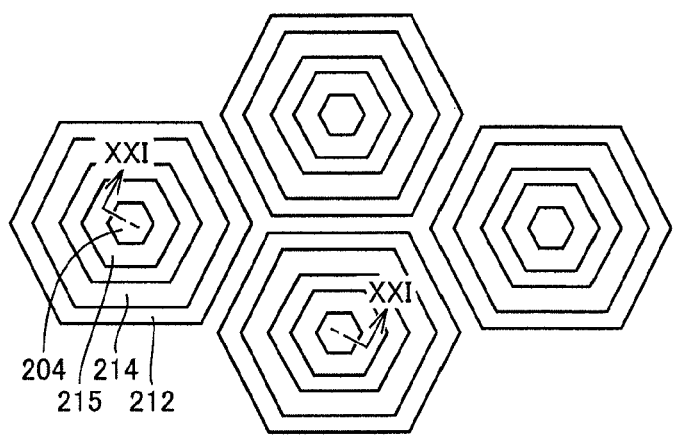
FIG. 22 is a schematic plan view of FIG. 21.

As shown in FIG. 21 and FIG. 22, a semiconductor device of the present embodiment is a silicon carbide semiconductor device, specifically, is a MOSFET 200, more specifically, is a vertical type VMOSFET (V-groove MOSFET). MOSFET 200 has a plurality of mesa structures and a trench formed between the mesa structures and having inclined side surfaces. The trench has side walls (side walls of the mesa structures) each constituted of a surface SW, which is configured substantially the same as surface SR described in the first embodiment. Accordingly, also in the present embodiment, as with the first embodiment, channel mobility in channel CH can be made large.

In the present embodiment, the macroscopic plane orientation of surface SW includes the plane orientation of (0-11-2) illustrated in the first embodiment, and five plane orientations equivalent to the plane orientation of (0-11-2). In other words, the macroscopic plane orientation of surface SW include the plane orientations of (0-11-2), (01-1-2), (10-1-2), (−101-2), (−110-2), and (1-10-2). These six plane orientations are equivalent to one another in the hexagonal structure and have a negative index m in a plane orientation of (hklm).

The following describes details of the structure of MOSFET 200. MOSFET 200 has an epitaxial substrate 290, a gate insulating film 213, a gate electrode 217, source electrodes 216, a drain electrode 218, and a source wire 233.

Epitaxial substrate 290 includes a single-crystal substrate 211, a breakdown voltage holding layer 212, p type body layers 214, n regions 215, and contact regions 204. Each of single-crystal substrate 211, breakdown voltage holding layer 212, and n regions 215 has n type conductivity. Each of the contact regions has p type conductivity.

Single-crystal substrate 211 is a silicon carbide substrate of hexagonal polytype 4H. One main surface (upper surface in FIG. 21) of single-crystal substrate 211 has a plane orientation almost corresponding to the (000-1) plane. On the one main surface of single-crystal substrate 111, breakdown voltage holding layer 212 made of silicon carbide is formed. Breakdown voltage holding layer 212 has an impurity concentration lower than that of single-crystal substrate 111. P type body layers 214 are formed on breakdown voltage holding layer 212. N regions 215 are formed on portions of p type body layer 214 so as to be separated from breakdown voltage holding layer 212 by p type body layers 214.

The epitaxial layer on the main surface of single-crystal substrate 211 is partially removed to form the plurality of (four in FIG. 22) mesa structures. Specifically, each of the mesa structures has upper surface and bottom surface both having a hexagonal shape, and has side walls inclined relative to the main surface of single-crystal substrate 211. Between adjacent mesa structures, the trench is formed to have surfaces SW constituted of the side walls of the mesa structures.

On each of surfaces SW, gate insulating film 213 is formed. This gate insulating film 213 extends onto the upper surface of each of n regions 215. Gate electrode 217 is formed on gate insulating film 213 to fill the inside of the trench (i.e., fill the space between adjacent mesa structures). Gate electrode 217 has an upper surface substantially as high as the upper surface of a portion of gate insulating film 213 on the upper surface of n region 215.

Interlayer insulating film 230 is formed to cover gate electrode 217 as well as the portion of gate insulating film 213 on the upper surface of each of n regions 215. Source electrode 216 is formed in contact with p type contact region 204 and n regions 215. Source wire 233 is formed in contact with the upper surface of source electrode 216 so as to extend on the upper surface of interlayer insulating film 230. Further, drain electrode 218 is formed on the backside surface of single-crystal substrate 211 opposite to its main surface on which breakdown voltage holding layer 212 is formed. This drain electrode 218 is an ohmic electrode.

The following describes a method for manufacturing MOSFET 200.

Figure 23:
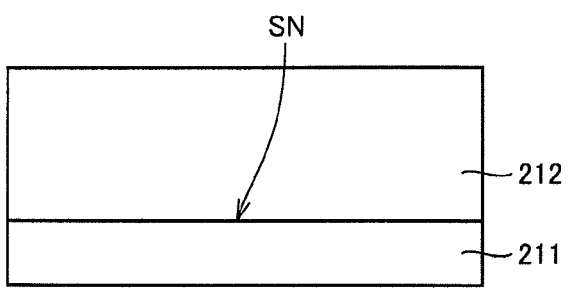
FIG. 23 is a cross sectional view schematically showing a first step of a method for manufacturing the semiconductor device in the second embodiment of the present invention.

As shown in FIG. 23, single-crystal substrate 211 is prepared which is made of silicon carbide, which has a hexagonal single-crystal structure of polytype 4H. Main surface SN of single-crystal substrate 211 preferably has a plane orientation corresponding to the (000-1) plane or a plane inclined by 5° or smaller relative to the (000-1) plane. Surface SN can be formed by means of mechanical polishing or slicing.

Next, on main surface SN, the epitaxial layer made of silicon carbide having n type conductivity is formed. The epitaxial layer serves as breakdown voltage holding layer 212. Breakdown voltage holding layer 212 is formed by means of epitaxial growth employing a CVD method that utilizes a mixed gas of silane ($SiH_4$) and propane ($C_3H_8$) as a material gas and utilizes hydrogen gas ($H_2$) as a carrier gas, for example. In doing so, it is preferable to introduce nitrogen (N) or phosphorus (P) as an impurity of n type conductivity, for example. This breakdown voltage holding layer 212 contains the n type impurity at a concentration of, for example, not less than $5 \times 10^{15}/cm^3$ and not more than $5 \times 10^{16}/cm^3$.

Next, ions are implanted into the upper surface layer of breakdown voltage holding layer 212, thereby forming p type body layer 214 and n region 215. In the ion implantation for forming p type body layer 214, ions of a p type impurity such as aluminum (Al) are implanted, for example. In doing so, by adjusting acceleration energy of the ions to be implanted, the depth of the region in which p type body layer 214 is to be formed can be adjusted.

Figure 24:
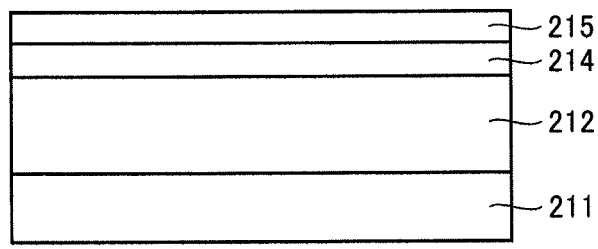
FIG. 24 is a cross sectional view schematically showing a second step of the method for manufacturing the semiconductor device in the second embodiment of the present invention.

Next, ions of an impurity of n type conductivity are implanted into breakdown voltage holding layer 212 thus having p type body layer 214 formed therein, thereby forming n regions 215. An exemplary, usable n type impurity is phosphorus (P) or the like. In this way, a structure shown in FIG. 24 is obtained.

Figure 25:
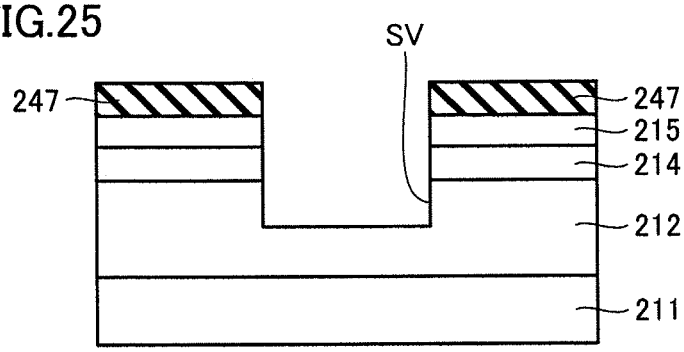
FIG. 25 is a cross sectional view schematically showing a third step of the method for manufacturing the semiconductor device in the second embodiment of the present invention.

As shown in FIG. 25, a mask layer 247 is formed on the upper surface of each of n regions 215. As mask layer 247, an insulating film such as a silicon oxide film can be used, for example. As a method for forming mask layer 247, the following process can be employed, for example. That is, a silicon oxide film is formed on the upper surface of n region 215 by means of the CVD method or the like. Then, a resist film (not shown) having a predetermined opening pattern is formed on the silicon oxide film by means of the photolithography method. Using the resist film as a mask, a portion of the silicon oxide film is removed by etching. Thereafter, the resist film is removed. As a result, mask layers 247 are formed which have an opening pattern in conformity with a region where the trench having surface SV is to be formed.

Then, using mask layers 247 as a mask, portions of n region 215, p type body layer 214, and breakdown voltage holding layer 212 are removed by means of etching. An exemplary, usable etching method is reactive ion etching (RIE), in particular, inductively coupled plasma (ICP) RIE. Specifically, for example, ICP-RIE can be employed using, as the reaction gas, $SF_6$ or a mixed gas of $SF_6$ and $O_2$. By means of such etching, a trench having surfaces SV having side walls substantially perpendicular to the main surface of single-crystal substrate 211 can be formed in the region where the trench shown in FIG. 21 is to be formed. In this way, a structure shown in FIG. 25 is obtained.

Figure 26:
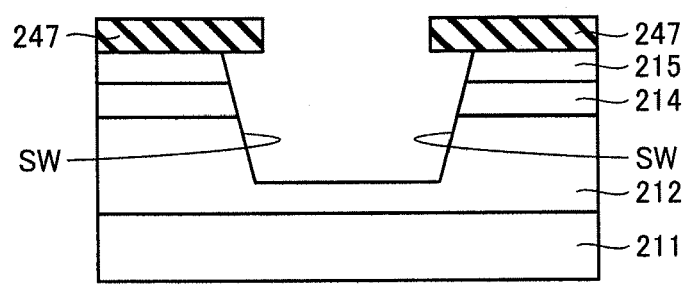
FIG. 26 is a cross sectional view schematically showing a fourth step of the method for manufacturing the semiconductor device in the second embodiment of the present invention.

Next, a thermal etching step is performed to exhibit a predetermined crystal plane in each of breakdown voltage holding layer 212, p type body layer 214, and n region 215. Specifically, each of the side walls of the trench shown in FIG. 25 is etched (thermally etched) at a heat treatment temperature of, for example, not less than 700° C. and not more than 1000° C. using a mixed gas of oxygen gas and chlorine gas as the reaction gas, thereby forming the trench having surfaces SW inclined relative to the main surface of single-crystal substrate 211 as shown in FIG. 26. On this occasion, as with the first embodiment, as shown in FIG. 6 and FIG. 7, plane S1 having a plane orientation of (0-33-8) and plane S2 connected to plane S1 and having a plane orientation different from that of plane S1 are alternately formed spontaneously.

Here, main reaction proceeds in the above-described thermal etching step when conditions for x and y, i.e., $0.5 \leq x \leq 2.0$ and $1.0 \leq y \leq 2.0$, are satisfied in a reaction formula expressed as $SiC + mO_2 + nCl_2 \rightarrow SiCl_x + CO_y$, where m, n, x, and y are positive numbers. The reaction (thermal etching) proceeds the most under conditions that x=4 and y=2 are satisfied. It should be noted that the reaction gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching SiC is, for example, approximately 70 µm/hr. Further, when using silicon oxide ($SiO_2$) as each of mask layers 247 in this case, a selection ratio of SiC to $SiO_2$ can be very large. Accordingly, each of mask layers 247 made of $SiO_2$ is not substantially etched during etching of SiC.

Figure 27:
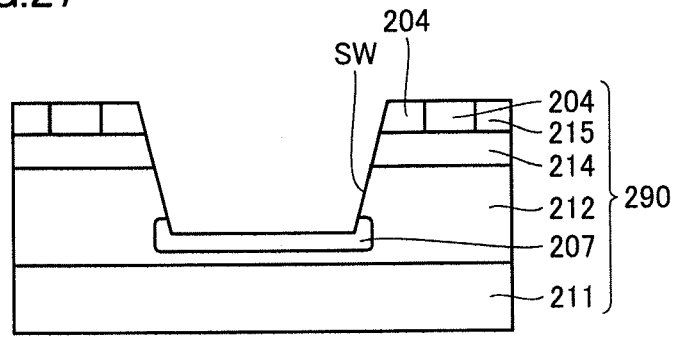
FIG. 27 is a cross sectional view schematically showing a fifth step of the method for manufacturing the semiconductor device in the second embodiment of the present invention.
Figure 28:
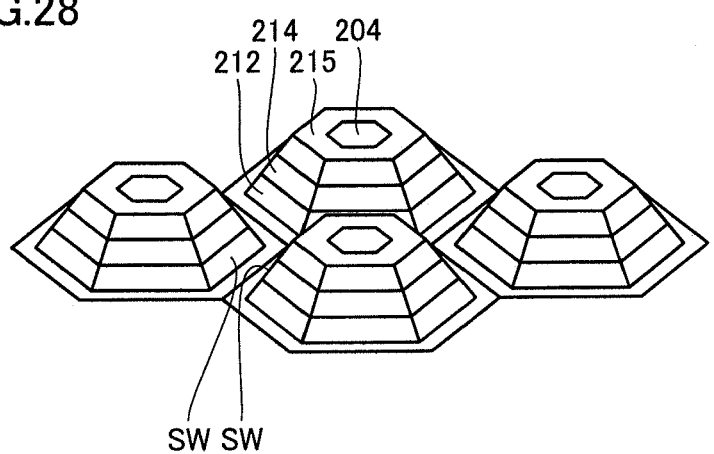
FIG. 28 is a schematic perspective view of FIG. 27.

Next, mask layer 247 is removed by means of an appropriate method such as etching. Thereafter, a resist film (not shown) having a predetermined pattern is formed using a photolithography method so as to extend from the inside of the trench onto each of the upper surfaces of n regions 215. As the resist film, there is used a resist film having an opening pattern in conformity with the bottom portion of the trench and a portion of the upper surface of n region 215. By implanting ions of an impurity of p type conductivity using this resist film as a mask, an electric field relaxing region 207 is formed at the bottom portion of the trench and contact region 204 of p type conductivity is formed at the region of the portion of n region 215. Thereafter, the resist film is removed. As a result, a structure shown in FIG. 27 and FIG. 28 is obtained. As seen from FIG. 28, the trench has a planar shape in the form of a mesh constituted of unit cells (each defined by annular portion of the trench surrounding one mesa structure) each having a hexagonal planar shape. Further, p type contact region 204 is disposed substantially at the central portion of the upper surface of each of the mesa structures as shown in FIG. 28. Further, p type contact region 204 has a planar shape similar to the shape of outer circumference of the upper surface of the mesa structure, i.e., has a hexagonal planar shape.

Then, an activation annealing step is performed to activate the impurity implanted by means of the above-described ion implantation.

Figure 29:
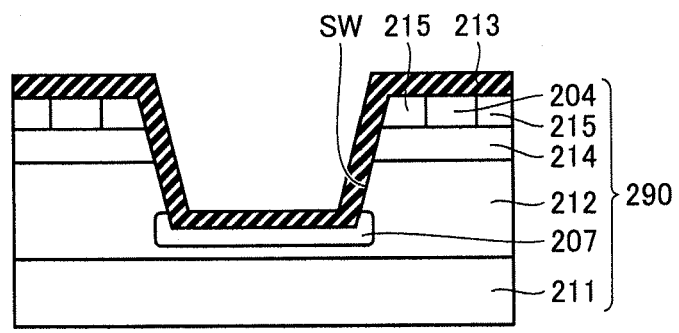
FIG. 29 is a cross sectional view schematically showing a sixth step of the method for manufacturing the semiconductor device in the second embodiment of the present invention.

Next, as shown in FIG. 29, gate insulating film 213 is formed to extend from the inside of the trench onto the upper surfaces of n region 215 and p type contact region 204. As gate insulating film 213, for example, there can be used an oxide film (silicon oxide film) obtained by thermally oxidizing the epitaxial layer made of silicon carbide. In this way, a structure shown in FIG. 29 is obtained.

Figure 30:
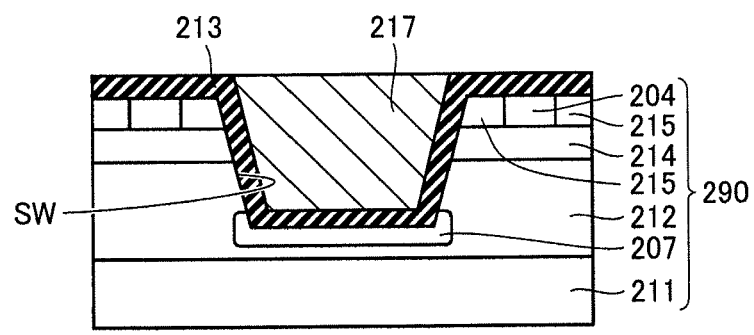
FIG. 30 is a cross sectional view schematically showing a seventh step of the method for manufacturing the semiconductor device in the second embodiment of the present invention.

Next, as shown in FIG. 30, gate electrode 217 is formed on gate insulating film 213 so as to fill the inside of the trench. As a method for forming gate electrode 217, the following method can be used, for example. First, a sputtering method or the like is employed to form a conductor film on gate insulating film 213. The conductor film is to be the gate electrode extending to the inside of the trench and to a region on p type contact region 204. The conductor film can be made of any material such as a metal as long as the material has conductivity. Thereafter, an appropriate method such as an etch back method or a CMP (Chemical Mechanical Polishing) method is used to remove a portion of the conductor film formed on regions other than the inside of the trench. As a result, the conductor film filling the inside of the trench remains to constitute gate electrode 217. In this way, a structure shown in FIG. 30 is obtained.

Next, interlayer insulating film 230 (see FIG. 31) is formed to cover the upper surface of gate electrode 217 and the upper surface of gate insulating film 213 exposed on p type contact region 204. The interlayer insulating film can be made of any material as long as the material is insulative. Further, a resist film having a pattern is formed on interlayer insulating film 230, using the photolithography method. The resist film (not shown) is provided with an opening pattern formed in conformity with a region on p type contact region 204.

Using this resist film as a mask, portions of interlayer insulating film 230 and gate insulating film 213 are removed by means of etching. As a result, openings (see FIG. 31) are formed to extend through interlayer insulating film 230 and gate insulating film 213. Each of the openings has a bottom portion at which p type contact region 204 and a portion of n region 215 are exposed. Thereafter, a conductor film to serve as source electrode 216 (see FIG. 31) is formed to fill the inside of this opening and cover the upper surface of the above-described resist film. Thereafter, the resist film is removed using a chemical solution or the like, thereby simultaneously removing (lifting off) the portion of the conductor film formed on the resist film. As a result, the conductor film filling the inside of the opening constitutes source electrode 216. This source electrode 216 is an ohmic electrode making ohmic contact with p type contact region 204 and n region 215.

Figure 31:
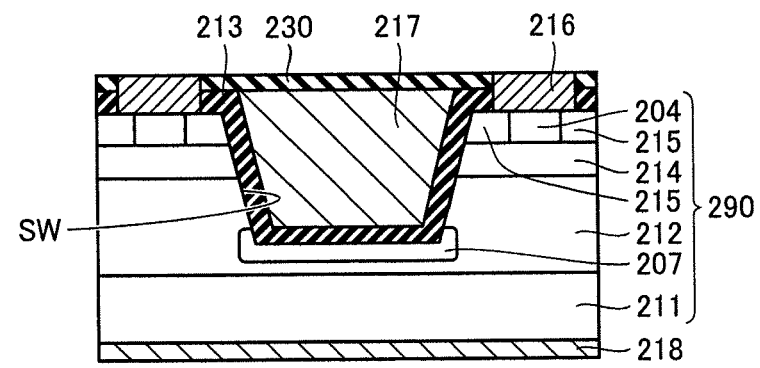
FIG. 31 is a cross sectional view schematically showing an eighth step of the method for manufacturing the semiconductor device in the second embodiment of the present invention.

Further, drain electrode 218 (see FIG. 31) is formed on the backside surface of single-crystal substrate 211 (the surface thereof opposite to the main surface thereof on which breakdown voltage holding layer 212 is formed). Drain electrode 218 can be made of any material as long as the material allows for ohmic contact with single-crystal substrate 211. In this way, a structure shown in FIG. 31 is obtained.

Thereafter, an appropriate method such as the sputtering method is employed to form source wire 233 (see FIG. 21), which makes contact with the upper surface of source electrode 216 and extends on the upper surface of interlayer insulating film 230. As a result, MOSFET 200 (FIG. 21 and FIG. 22) is obtained.

It should be noted that as with surface SR in the first embodiment, surface SW is constituted of the planes (planes S1 in FIG. 7) having a plane orientation of (001) in the structure equivalent to the cubic structure and the planes (planes S2 in FIG. 7) connected to the foregoing planes and having a plane orientation different from that of each of the foregoing planes. Such a configuration is also possible in a single-crystal structure other than polytype 4H. This single-crystal structure is not limited to the hexagonal structure, may be a single-crystal structure other than the cubic structure, and may be a rhombohedral structure, for example. Further, the polytype is not limited to 4H, and may be 6H or 15R, for example. Further, the semiconductor is not limited to silicon carbide (SiC), and may be gallium nitride (GaN), for example.

Further, the VMOSFET (V-groove MOSFET) has been illustrated, but the semiconductor device may be a UMOSFET (U-groove MOSFET). In other words, the macroscopic plane orientation of the surface of channel CH may be perpendicular to the main surface of the single-crystal substrate. In this case, channels opposite to each other are provided and the respective surfaces of the channels have plane orientations opposite to each other. For example, the following channels are provided: a channel having a macroscopic plane orientation of (0-11-2); and a channel having a macroscopic plane orientation of (01-12).

It should be noted that by replacing n type and p type with each other in the MOSFET having the n channel in each of the above-described embodiments, the MOSFET may have a p channel. However, in order to obtain a higher channel mobility, the n channel is more preferable.

Further, in each of the above-described embodiments, the epitaxial substrate has been used, but the epitaxial substrate's portion corresponding to the epitaxial layer may be formed by implantation of an impurity instead of the epitaxial growth.

Further, the MOSFET has been described in detail, but the semiconductor device may be a MISFET (Metal Insulator Semiconductor Field Effect Transistor) other than the MOSFET. Moreover, the semiconductor device is not limited to the MISFET as long as it has a channel surface. For example, the semiconductor device may be an IGBT (Insulated Gate Bipolar Transistor).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a substrate having a surface made of a semiconductor having a hexagonal single-crystal structure of polytype 4H, said surface of said substrate being constructed by alternately providing a first plane having a plane orientation of (0-33-8) and a second plane connected to said first plane and having a plane orientation different from said plane orientation of said first plane;
   a gate insulating film provided on said surface of said substrate; and
   a gate electrode provided on said gate insulating film.

2. The semiconductor device according to claim 1, wherein said second plane has a plane orientation of (0-11-1).

3. The semiconductor device according to claim 1, wherein said semiconductor is silicon carbide.

4. A semiconductor device comprising:
   a substrate having a surface made of a semiconductor having a single-crystal structure other than a cubic structure, said single-crystal structure cyclically including an equivalent structure to the cubic structure, said surface of said substrate being constructed by alternately providing a first plane having a plane orientation of (001) in said equivalent structure, and a second plane connected to said first plane and having a plane orientation different from said plane orientation of said first plane;
   a gate insulating film provided on said surface of said substrate; and
   a gate electrode provided on said gate insulating film.

5. The semiconductor device according to claim 4, wherein said single-crystal structure has one of a hexagonal structure and a rhombohedral structure.

6. A method for manufacturing a semiconductor device, comprising the steps of:
preparing a substrate having a surface made of silicon carbide having a hexagonal single-crystal structure of polytype 4H;
chemically treating said surface of said substrate so as to alternately form, in said surface of said substrate, a first plane having a plane orientation of (0-33-8) and a second plane connected to said first plane and having a plane orientation different from said plane orientation of said first plane;
forming a gate insulating film on said surface of said substrate; and
forming a gate electrode on said gate insulating film.

7. The method for manufacturing the semiconductor device according to claim 6, wherein said second plane has a plane orientation of (0-11-1).

8. The method for manufacturing the semiconductor device according to claim 6, wherein the step of chemically treating said surface includes the step of chemically etching said surface.

9. The method for manufacturing the semiconductor device according to claim 8, wherein the step of chemically etching said surface includes the step of thermally etching said surface.

10. The method for manufacturing the semiconductor device according to claim 9, wherein the step of thermally etching said surface includes the step of heating said substrate in an atmosphere including at least one or more types of halogen atom.

11. The method for manufacturing the semiconductor device according to claim 10, wherein said at least one or more types of halogen atom includes at least one of chlorine atom and fluorine atom.

12. A semiconductor device comprising:
a semiconductor substrate having a trench;
a gate insulating film provided on a side surface of said trench; and
a gate electrode provided on said gate insulating film;
said side surface of said trench extending along a plane having a plane orientation of (0-11-2) and including a first plane having a plane orientation of (0-33-8) and a second plane connected to said first plane and having a plane orientation different from said plane orientation of said first plane.

13. The semiconductor device according to claim 12, wherein said second plane has a plane orientation of (0-11-1).

14. The semiconductor device according to claim 12, wherein said side surface of said trench includes first to sixth side surfaces, said first to sixth side surfaces extend along either one of a plane having a plane orientation of (0-11-2), a plane having a plane orientation of (01-1-2), a plane having a plane orientation of (10-1-2), a plane having a plane orientation of (-101-2), a plane having a plane orientation of (-110-2), and a plane having a plane orientation of (1-10-2).

15. The semiconductor device according to claim 12, wherein an inclination of said side surface of said trench with respect to said plane having a plane orientation of (0-11-2) is within ±5 degrees in the direction of <0-110>.

16. A semiconductor device comprising:
a substrate having a trench;
a gate insulating film provided on a side surface of said trench; and
a gate electrode provided on said gate insulating film;
a side surface of said trench including a first plane having a plane orientation of (0-33-8), a second plane connected to said first plane and having a plane orientation different from said plane orientation of said first plane, and a third plane connected to said second plane and having a plane orientation of (0-33-8).

17. The semiconductor device according to claim 16, wherein said second plane has a plane orientation of (0-11-1).

* * * * *